United States Patent [19]

Inayoshi et al.

[11] 4,199,491

[45] Apr. 22, 1980

[54] POLYOLEFIN RESIN COMPOSITION

[75] Inventors: Akio Inayoshi; Hitomi Tomari, both of Sodegaura; Kikuo Nagatoshi, Kisarazu; Yasuo Hata, Sodegaura, all of Japan

[73] Assignee: Idemitsu Kosan Company Limited, Chiyoda, Japan

[21] Appl. No.: 965,860

[22] Filed: Dec. 4, 1978

[30] Foreign Application Priority Data

Dec. 23, 1977 [JP] Japan .............................. 52/154397
Jan. 30, 1978 [JP] Japan .................................. 53/8357

[51] Int. Cl.$^2$ .............................................. C08K 5/06
[52] U.S. Cl. ........................... 260/31.2 R; 260/32.6 A;
260/32.6 PQ; 260/33.2 R; 260/42.43; 427/306;
525/125; 525/127; 525/203; 525/222
[58] Field of Search .................... 427/306; 260/878 R,
260/42.43, 33.2 R, 31.2 R, 32.6 A, 32.6 PQ,
881; 428/290

[56] References Cited

U.S. PATENT DOCUMENTS

| | | | |
|---|---|---|---|
| 3,953,655 | 4/1976 | Steinkamp et al. | 260/878 R |
| 4,063,004 | 12/1977 | Quinn | 427/306 X |

Primary Examiner—Sandra M. Person
Attorney, Agent, or Firm—Frishauf, Holtz, Goodman, Woodward

[57] ABSTRACT

Since their surfaces are inactive, polyolefin resins are difficult to plate. A plating method utilizing sensitizing-activation of the surface has been used for plating polyolefin resins. Many attempts have been made to improve the plating properties of the surfaces of polyolefin resins, for example, a mechanical method, a method employing a solvent, a method of coating other types of resins on the surface, etc. As methods modifying the plastics themselves, there are several; a method of introducing polar radicals by graft polymerization, etc., a method of introducing atactic polypropylene or block copolymer of polypropylene and polyethylene, a method of mixing rubber or a copolymer of ethylene and vinyl acetate, a method of mixing in an inorganic filler, etc.

Recently, it was attempted to apply a high chrome etching-catalyst method for plating polyolefin resin, said method being mainly used in the automatic process of plating although the plating adhesion is poorer than that obtained with the plating method of sensitizing-activation. However, there was found no polyolefin resin composition having plating properties that can compare with ABS resin for applying the plating method of a high chrome etching-catalyst method.

We have developed a polyolefin resin composition which can be plated by a high-chrome etching-catalyst method. As a result, we have found that the object of the invention can be attained by blending a compound containing a cyano group with a mixture consisting of polyolefin resin and inorganic filler, and kneading and melting them.

12 Claims, No Drawings

POLYOLEFIN RESIN COMPOSITION

CROSS REFERENCE

U.S. Pat. No. 4,111,898 (U.S. Ser. No. 845,537). To the product of the process of this patent, the plating method of high chrome etching-catalyst process can not be applied. Further, the plated product of said patent process would be inferior to that of the present invention on the peeling test, when applied by the plating method of the high chrome etching-catalyst process.

SUMMARY OF THE INVENTION

A polyolefin resin composition having excellent plating properties comprising; (A) 100 parts by weight of a mixture consisting of from 20 to 80 weight percent of polyolefin resin and from 80 to 20 weight percent of inorganic filler, (B) from 3 to 60 parts by weight of a compound containing a cyano group, (C) from 0 to 20 parts by weight of rubber, (D) from 0 to 50 parts by weight of unsaturated carboxylic acid added-polyolefin resin and (E) from 0 to 20 parts by weight of nonionic surfactant and/or polyethyleneglycol.

DETAILED DESCRIPTION OF THE INVENTION

The present invention provides a polyolefin resin composition having excellent plating properties which is produced by blending a compound containing a cyano group with a mixture consisting of polyolefin resin and inorganic filler.

Any polyolefin resin can be used in the method of the present invention. Suitable examples are monoolefin polymers such as low density polyethylene, medium density polyethylene, high density polyethylene, polypropylene, polybutene-1, poly-4-methylpentene-1 and the like; copolymers such as ethylene-propylene copolymer, ethylene-butene copolymer and the like; mixtures thereof and the like. The amount of said polyolefin resin added has no limitation, but as plating material, it should be controlled to occupy from 20 to 80 weight percent, preferably from 40 to 80 weight percent, of the mixture consisting of a polyolefin resin and inorganic filler.

Inorganic filler which can be used in the present invention is alumina, zinc white, magnesium oxide, calcium carbonate, talc, clay, silica, kieselguhr, mica, calcium sulfite, calcium sulfate, barium sulfate, titanium oxide, calcium silicate, glass powder, glass fiber, asbestos, gypsum fiber, mixture thereof, and the like. The said inorganic filler is not especially limited in its shape and size, but the average particle size is desired to be not more than 10 microns when it is in particle form. The inorganic filler is not particularly limited in the amount added, but as a plating material it is desired to be used in the ratio of from 80 to 20 weight percent, preferably from 60 to 20 weight percent, of the whole mixture consisting of polyolefin resin and inorganic filler. The above-described amount of the inorganic filler is by taking into account the balance of plating properties, mechanical properties and moldability. When the amount of the inorganic filler is less than 20 weight percent, the coarsening effect resulting from etching is insufficient, whereas above 80 weight percent, problems are caused in workability and moldability, and in addition, undesirable excessive surface coarsening results.

The amount of a compound containing a cyano group added is not particularly limited, but as plating material it is from 3 to 60 parts by weight, preferably from 5 to 40 parts by weight, based on 100 parts by weight of the mixture consisting of polyolefin resin and inorganic filler. When the amount is below 3 parts by weight, the plating properties of the resulting composition are insufficient, whereas above 60 parts by weight, the proportion of the compound containing the cyano group is too large to be modifying the polyolefin resin which is the object of the present invention.

The compounds containing a cyano group which can be used in the present invention are acrylonitrile resins such as acrylonitrile-styrene resin (AS resin), acrylonitrile-butadiene-styrene resin (ABS resin), acrylonitrile-methylacrylate resin (A-MA resin), acrylonitrile-indene resin (A-IN resin), acrylonitrile-itaconic acid resin, acrylonitrile-methyl methacrylate-styrene resin, acrylonitrile-cyclopentadiene resin, etc., and low molecular weight compounds such as terephthalodinitrile, $\beta$-naphthonitrile or the like which have a cyano group and are solid at ordinary temperature. The above-described acrylonitrile resins are applicable also in the form of a block copolymer or graft copolymer.

In the composition of the present invention, it is essential to add an inorganic filler and a compound containing a cyano group to a polyolefin resin, and lack of any of said components causes lower plating properties, unplated parts, lowered adhesive properties or poor thermal properties. Furthermore, rubber and unsaturated carboxylic acid added-polyolefin resins can be blended in, in order to improve the adhesive properties, if desired. As the rubber, either liquid rubber or solid rubber can be used. Examples of solid rubbers are diene rubber such as isoprene rubber, butadiene rubber, styrene-butadiene rubber, acrylonitrile-butadiene rubber, etc. The liquid rubbers preferably used in the present invention are those polymers comprised mainly of diene monomer and having an average molecular weight of from 500 to 10,000, and in addition, showing fluidity at room temperature. As examples of these liquid rubbers are compounds which are obtained by introducing functional groups such as a carboxyl group, hydroxy group, mercapto group, halogen atom, amino group, aziridino group, expoxy group, etc., into the following compounds: 1,2-Polybutadiene, 1,4-polybutadiene, polyisoprene, polychloroprene, 1,2-polypentadiene, styrene-butadiene copolymer, acrylonitrile-butadiene copolymer, butadiene-isoprene copolymer, and butadiene-pentadiene copolymer; unsaturated dicarboxylic acid half esters such as terminal hydroxylated 1,2-polybutadiene, 1,4-polybutadiene; polymer, not containing any functional group and having an average molecular weight of from 500 to 10,000 such as 1,2-polybutadiene, 1,4-polybutadiene, styrene-butadiene copolymer, acrylonitrile-butadiene copolymer, etc.; heat-decomposed rubber, ozone-decomposed rubber, etc.; and mixtures thereof.

The amount of the above-described rubber added is not limited particularly, but as plating material, it is desired to be from 0 to 20 parts by weight, usually from 1 to 20 parts by weight, preferably from 1 to 10 parts by weight, based on 100 parts by weight of the mixture consisting of polyolefin resin and inorganic filler. If rubber is added in the above range, the adhesion properties of the metal coating plated are improved. Among the rubbers, the liquid rubber acts as a plasticizer for polyolefin resin, providing a good mold having less mold-deformation and suitable for plating.

Unsaturated carboxylic acid added-polyolefin resin means polyolefin resin which contains an unsaturated carboxylic acid such as maleic anhydride as a polar radical. A commercially available one may be employed, but those which are produced by the following process are preferred. While simultaneously adding an unsaturated carboxylic acid to polyolefin resin, a liquid rubber and a radical generator are added to react in a solvent and thus the product is obtained. By this process, the resulting unsaturated carboxylic acid added-polyolefin resin contains a large amount of unsaturated carboxylic acid, which is combined in an activated state so that it is excellent as the starting material for the composition of the present invention. In the above process, the blending ratios of each component can not be determined unequivocally as they differ under various conditions. An example is, from 5 to 50 parts by weight of an unsaturated carboxylic acid, from 1.0 to 20 parts by weight of a liquid rubber, and from 0.5 to 10 parts by weight of a radical generator are mixed to 100 parts by weight of polyolefin resin. At this time, a solid rubber can be used instead of a liquid rubber. Furthermore, said desired unsaturated carboxylic acid added-polyolefin resin can be obtained by fusing and kneading the above components. In this fusion procedure, it is not necessary to react the components in the solvent.

Unsaturated carboxylic acid added-polyolefin resin used in the present invention are of various kinds. Unsaturated carboxylic acids to be added are, for example, maleic acid, maleic anhydride, nudic anhydride, citraconic acid, crotonic acid, isocrotonic acid, mesaconic acid, itaconic acid, angelic acid, sorbic acid, methacrylic acid, itaconic anhydride, citraconic anhydride, acrylic acid, or derivatives thereof (metallic salt, amide, imide, esters, etc.), and among them maleic anhydride is the most suitable. Examples of radical generators are benzoyl peroxide, lauryl peroxide, azobisisobutylonitrile, cumene peroxide, dicumyl peroxide, t-butylhydroperoxide, α,α'-bis(t-butylperoxydiisopropyl)benzene, di-t-butylperoxide, 2,5-di(t-butylperoxy) hexane, etc.

Polyolefin resins used as the base are not limited particularly, but suitable examples are monoolefin polymers such as low density polyethylene, medium density polyethylene, high density polyethylene, polypropylene, polybutene-1, and poly-4-methylpentene-1; copolymers such as ethylene-propylene copolymer and ethylene-butene copolymer; mixtures thereof and the like.

The amount of the above-described unsaturated carboxylic acid added-polyolefin resin, which is not limited particularly, is suggested to be from 0 to 50 parts by weight, usually from 0.5 to 50 parts by weight, preferably from 0.5 to 30 parts by weight, based on 100 parts by weight of a mixture consisting of polyolefin resin and inorganic filler. Addition of unsaturated carboxylic acid added-polyolefin resin enables one to improve the adhesion properties without lowering mechanical strength and heat resistence.

In general, since polyolefin resins have a hydrophobic surface which is disadvantageous in that (i) wetness at etching is poor, resulting in heterogeneous etching that causes adhesion of the plating film to be insufficient, and (ii) in some forms of moldings, non-wetted parts lower the plating adhesion. Accordingly, in order to improve wetness during etching, nonionic surfactants and polyethyleneglycols can be added singly or in combination to provide the polyolefin resin with hydrophilic properties. As the nonionic surfactants, polyoxyethylene alkylether, polyoxyethylene alkylphenolether, polyoxyethylene alkylester, polyoxyethylene sorbitanalkylester, polyoxyethylene alkylamine, etc., which are condensation products of ethyleneoxide and other compounds, may be employed. In addition to the above, sorbitanalkylester, fatty acid diethanolamide and the like can be employed. Though it is not a nonionic surfactant, polyethyleneglycol, which is the condensation product of ethyleneoxide itself, is also applicable. The amount of nonionic surfactant and/or polyethyleneglycol is not particularly limited, but it is desired that it be in the range of from 0 to 20 parts by weight, usually from 0.3 to 20 parts by weight, preferably from 0.3 to 15 parts, based on 100 parts by weight of a mixture consisting of polyolefin resin and inorganic filler.

In addition to the above-described ingredients, if necessary, a coloring agent, stabilizer, plasticizer, lubricant and the like can be added.

The above ingredients are kneaded with a mixing roll, Bumbury's mixer, an extruder, a continuous kneader, etc., while heating at a temperature of from 110° to 280° C. to obtain pellets of the polyolefin resin composition.

When plating is carried out on the moldings obtained by fusion molding of the resin composition of the present invention after heating and kneading, for example, application of plating processing usually employed in the automatic process for plating ABS resin, i.e., degreasing, high chrome content chemical etching using a mixed solution of chromic acid and sulfuric acid, pickling with a dilute solution of hydrochloric acid, dipping in a mixed solution of stannous chloride and palladium chloride for providing sensitivity, activation using dilute solution of hydrochloric acid, chemical nickel plating and electroplating, provides a plated product having good adhesion properties of a metal coating and good appearance.

Thus the resin composition of the present invention is useful as a material for plating, able to be plated by high chrome etching-catalyst method which usually finds difficulties in plating plastics, having strong adherence between the resin and plate coating, which can sufficiently resist the thermal shock test (4 cycles or more, 1 cycle: $+80°$ C. $\sim -30°$ C.). In addition, the products are excellent both in appearance and in mechanical strength. Therefore, the resin composition of the present invention finds wide applications in automobile parts, parts for electric appliances, and other industrial parts.

The following Examples are given to illustrate the present invention in more detail.

EXAMPLE 1

To 100 parts by weight of a mixture obtained by blending 65 weight % of polypropylene (Melt Index: 8 grams/10 minutes, density: 0.91 grams/cm$^3$, homopolymer) and 35 weight % of talc (average particle size: 4.2 μ) were added 10 parts by weight of ABS resin (20 weight % of acrylonitrile, 50 weight % of butadiene, 30 weight % of styrene) as the compound containing a cyano group. The resulting mixture was mixed and reacted by kneading in a Bumbury's mixer at a temperature of from 180° to 210° C. for 6 minutes.

Thereafter, the mixture was pelletized and injected from In-Line Screw Type Injection Machine (5 OZ, mold pressure 150 kg/cm$^2$G) to form a plate of a thickness of 3 millimeters, a length of 125 millimeters and a width of 63 millimeters.

The plate was plated according to the plating processing usually employed for ABS resin. That is, the plate was first degreased and dipped in a high chrome content chemical etching solution (65°±5° C.) for 10 minutes, the chemical etching solution being prepared by adding water to 250 milliliters of sulfuric acid (density: 1.83) and 440 grams of chromic anhydride to make 1 liter. The plate was prickled (HCl 35%, 50 cc/l) at 30° C. for one minute, then dipped in a catalyst solution (mixture of stannous chloride solution and palladium chloride solution) at 30° C. for 3 minutes to effect sensitivity-providing processing. The plate was then subjected to an accelerator at 30° C. for 2.5 minutes, and thereafter subjected to chemical nickel plating. As to electroplating, copper plating was applied to a thickness of about $50\mu$ for the Peeling Test, and copper plating, nickel plating and chrome plating were applied to make a thickness of about $20\mu$ for appearance evaluation of plated products and thermal repeated test.

Plating properties on molding were determined by visually evaluating the appearance of the plated product, peeling of the plate coating, and performing a thermal shock test (one hour at +80° C., then one hour at −30° C., this cycle was repeated four times) as thermal repeated test. The results obtained are shown in Table 1.

The result on the mechanical strength and the thermal properties of the product are shown in Table 3.

EXAMPLE 2

The same procedure as in Example 1 was carried out except that 35 parts by weight of titanium dioxide (average particle size $0.5\mu$) was used in place of talc, and a plated product was obtained. The results of evaluation of the plating properties of the product are shown in Table 1, and the results of the mechanical strength and the thermal properties of the product are shown in Table 3.

EXAMPLE 3

The same procedure as in Example 1 was carried out, adding 3.5 parts by weight of isoprene rubber (Mooney viscosity: 55 at 100° C.) to the composition of Example 1, and a plated product was obtained. The results of evaluating the plating properties of the said product are shown in Table 1, and the results of the mechanical strength and the thermal properties of the product are shown in Table 3.

EXAMPLE 4

The same procedure as in Example 1 was carried out except that the amount of polypropylene was decreased to 55 weight % while the amount of talc was increased to 45 weight %. The results of the evaluation of plating properties of the said product are shown in Table 1.

EXAMPLE 5

To 100 parts by weight of the mixture being prepared by blending 60 weight % of polypropylene and 40 weight % of talc (average particle size: $4.2\mu$), which were used in Example 1, were added and mixed 20 parts by weight of ABS resin used in Example 1 as the compound containing a cyano group and 5 parts by weight of polyoxyethylene nonylphenolether (addition mole number of ethyleneoxide: 10) as a nonionic surfactant. The same procedure as in Example 1 was carried out to obtain a plated product. The results of the evaluation of the plating properties are shown in Table 1, and the results of the mechanical strength and the thermal properties are shown in Table 3.

EXAMPLE 6

To the composition of Example 1 were added and mixed 5 parts by weight of polyethyleneglycol #4000 and 5 parts by weight of maleic anhydride added-polypropylene (maleic anhydride content: 5 weight percent). On the resulting mixture the same procedure as in Example 1 was carried out. The results of the evaluation of the plating properties are shown in Table 1, and the results of the mechanical strength and the thermal properties are shown in Table 3.

EXAMPLE 7

To the composition of Example 1 were added 5 parts by weight of SBR (Mooney viscosity: 50), 5 parts by weight of polyethyleneglycol #6000 and 3 parts by weight of maleic anhydride added-polypropylene used in Example 6. On the resulting mixture, the same procedure as in Example 1 was carried out. The results of the evaluation of the plating properties are shown in Table 1, and the results of the mechanical strength and the thermal properties are shown in Table 3.

EXAMPLE 8

The same procedure as in Example 1 was carried out except that 25 parts by weight of AS resin (acrylonitrile 34 mol %, styrene 66 mol %) was used in place of ABS resin to obtain a plated product. The results of the evaluation of the plating properties are shown in Table 1, and the results of the mechanical strength and the thermal properties are shown in Table 3.

EXAMPLE 9

To the composition of Example 8 were added 3.5 parts by weight of terminal hydroxylated 1,4-polybutadiene (number average molecular weight: 3,000, viscosity: 50 poise/30° C., OH group content: 0.83 milligrams equivalent/gram) as rubber. On the resulting mixture, the same procedure as in Example 1 was carried out to obtain a plated product. The results of evaluating the plating properties are shown in Table 1, and the results of the mechanical strength and the thermal properties are shown in Table 3.

EXAMPLE 10

To 100 parts by weight of a mixture prepared by blending 65 weight % of polypropylene (Melt Index: 9 grams/10 minutes, density: 0.91 grams/cm$^3$, block copolymer with ethylene) and 35 weight parts of kieselguhr (average particle size $7.5\mu$) were added 10 parts by weight of AS resin used in Example 8 and 3 parts by weight of polyoxyethylene dodecylamine (addition mole number of ethylene oxide: 4). To the resulting mixture, the same procedure as in Example 1 was carried out to obtain a plated product. The results of evaluating the plating properties are shown in Table 1, and the results of the mechanical strength and the thermal properties are shown in Table 3.

EXAMPLE 11

To 100 parts by weight of a mixture prepared by blending 70 weight % of polypropylene (Melt Index: 8 grams/10 minutes, density: 0.9, random copolymer with ethylene) and 30 weight parts of barium sulfate (average particle size $0.8\mu$) were added 10 parts by weight of AS resin used in Example 8, 2 parts by weight of polyoxyethylenedecylamine, 2 parts by weight of polyethyleneglycol #1000, and 3 parts by weight of maleic anhydride added-polypropylene used in Example 7. To the resulting mixture, the same procedure as in Example 1 was carried out to obtain a plated product. The results of the evaluation of the plating properties are shown in Table 1.

EXAMPLE 12

The same procedure as in Example 1 was carried out except that 10 parts by weight of AS resin used in Example 8 in place of ABS resin, 5 parts by weight of SBR used in Example 7 and 2 parts by weight of polyoxyethylenenonylphenolether were added and mixed. The results of evaluating the plating properties of the obtained product are shown in Table 1.

EXAMPLE 13

To 100 parts by weight of a mixture prepared by blending 65 weight % of polypropylene used in Example 11 and 35 weight % of talc, was added 10 parts by weight of A-MA resin (copolymer of 43 mol % of acrylonitrile and 57 mol % of methyl acrylate) as the compound containing a cyano group. To the resulting mixture, the same procedure as in Example 1 was carried out to obtain a plated product. The results of the evaluation of the plating properties are shown in Table 1, and the results of the mechanical strength and the thermal properties are shown in Table 3.

EXAMPLE 14

To 100 parts by weight of a mixture prepared by blending 50 weight % of polypropylene used in Example 1 and 50 weight % of calcium carbonate (average particle size: 1.5μ), were added 25 parts by weight of A-MA resin used in Example 13 and 35 parts by weight of SBR (Mooney viscosity: 50). To the resulting mixture, the same procedure as in Example 1 was carried out to obtain a plated product. The results of the plating properties are shown in Table 1.

EXAMPLE 15

To 100 parts by weight of a mixture prepared by blending 65 weight % of homopolymer of polypropylene used in Example 1 and 35 weight % of talc, were added 20 parts by weight of A-MA resin used in Example 13, 5 parts by weight of fatty acid diethanolamide and 10 parts by weight of acrylic acid added-polypropylene (acrylic acid content: 6 weight percent). To the resulting mixture the same procedure as in Example 1 was carried out to obtain a plated product. The results of evaluating the plating properties are shown in Table 1, and the results of the mechanical strength and the thermal properties are shown in Table 3.

EXAMPLE 16

To 100 parts by weight of a mixture prepared by blending 65 weight % of polyethylene (Melt Index: 6.0 grams/10 minutes, density: 0.968 grams/cm$^3$) and 35 weight % of clay (average particle size: 2.6μ) was added 10 parts by weight of A-MA resin (acrylonitrile 60 mol %, methyl acrylate 40 mol %). To the resulting mixture the same procedure as in Example 1 was carried out to obtain a plated product. The results of evaluating the plating properties are shown in Table 1, and the results on the mechanical strength and the thermal properties are shown in Table 3.

EXAMPLE 17

To 100 parts by weight of a mixture prepared by blending 65 weight % of polyethylene used in Example 16 and 35 weight % of talc, were added 30 parts by weight of A-MA resin used in Example 13 and 5 parts by weight of sorbitanmonolaurate. The resulting mixture was subjected to the same procedure as in Example 1 to obtain a plated product. The results of evaluating the plating properties are shown in Table 1.

EXAMPLE 18

To 100 parts by weight of a mixture prepared by blending 65 weight % of polyethylene used in Example 16 and 35 weight % of talc, were added 30 parts by weight of A-MA resin used in Example 13, 10 parts by weight of sorbitanmonolaurate and 5 parts by weight of acrylic acid added-polyethylene (acrylic acid content: 1.2 weight percent). To the resulting mixture the same procedure as in Example 1 was carried out to obtain a plated product. The results of evaluating the plating properties are shown in Table 1.

EXAMPLE 19

To 100 parts by weight of a mixture prepared by blending 65 weight % of polypropylene used in Example 10 and 35 weight % of talc, was added 10 parts by weight of acrylonitrile-indene resin (acrylonitril 34 mol %, indene 66 mol %). To the resulting mixture the same procedure as in Example 1 was carried out to obtain a plated product. The results of evaluating the plating properties are shown in Table 1, and the results of the mechanical strength and the thermal property are shown in Table 3.

EXAMPLE 20

The same procedure as in Example 1 was carried out except that 10 parts by weight of acrylonitrile-itaconic acid resin (acrylonitrile 50 mol %, itaconic acid 50 mol %) was used in place of ABS resin, to obtain a plated product. The results of evaluating the plating properties are shown in Table 1.

EXAMPLE 21

The same procedures as in Example 1 were carried out except that 10 parts by weight of acrylonitrile-methyl methacrylate-styrene resin (acrylonitrile 33 mol %, methyl methacrylate 33 mol%, styrene 34 mol%) was used in place of ABS resin, to obtain a plated product. The results of evaluating the plating properties are shown in Table 1.

EXAMPLE 22

To 100 parts by weight of a mixture prepared by blending 65 weight % of polypropylene used in Example 11 and 35 weight % of talc, was added 10 parts by weight of acrylonitrile-cyclopentadiene resin (acrylonitrile 70 mol %, cyclopentadiene 30 mol %, cyanoethylation addition product). To the resulting mixture the same procedure as in Example 1 was carried out to obtain a plated product. The results of evaluating the plating properties are shown in Table 1.

EXAMPLE 23

The same procedure as in Example 22 was carried out except that 5 parts by weight of terephthalodinitrile was used in place of acrylonitrile-cyclopentadiene resin, to obtain a plated product. The results of evaluating the plating properties are shown in Table 1, and the results of the mechanical strength and the thermal properties are shown in Table 3.

EXAMPLE 24

To 100 parts by weight of a mixture prepared by blending 60 weight % of polypropylene used in Example 1 and 40 weight % of clay, was added 5 parts by weight of β-naphtonitril. To the resulting mixture the same procedure as in Example 1 was carried out to obtain a plated product. The results of evaluating the plating properties are shown in Table 1.

EXAMPLE 25

To 100 parts by weight of a mixture prepared by blending 65 weight % of polypropylene used in Example 1 and 35 weight % of talc (average particle size 4.2μ), were added 10 parts by weight of AS resin (copolymer of 50 mole % of acrylonitril and 50 mole % of styrene) as the compound containing a cyano group, 3.5 parts by weight of terminal hydroxylated 1,4-polybutadiene (number average molecular weight: 3,000, viscosity: 50 poise/30° C., OH group content: 0.83 milligrams equivalent/gram) as a rubber, 0.5 parts by weight of itaconic acid as the unsaturated carboxylic acid and 0.022 parts by weight of α,α'-bis(t-butylperoxydiisopropyl)benzene as radical initiator. To the resulting mixture, the same procedure as in Example 1 was performed to obtain a plated product. The results of evaluation of the plating properties are shown in Table 1.

COMPARATIVE EXAMPLE 1

The same procedure as in Example 1 was employed using 65 weight % of the polypropylene used in Example 1 and 35 weight % of talc, to obtain a plated product. The results of evaluating the plating properties are shown in Table 2, and the results of the mechanical strength and the thermal properties are shown in Table 3.

COMPARATIVE EXAMPLE 2

To 100 parts by weight of the components of Example 1, was added 3.5 parts by weight of terminal hydroxylated 1,4-polybutadiene in the form of liquid rubber. A plated product was obtained in the same manner as in Example 1. The results of evaluating the plating properties are shown in Table 2.

COMPARATIVE EXAMPLE 3

To 100 parts by weight of a mixture prepared by blending 70 weight % of polypropylene used in Example 1 and 40 weight % of talc, was added 5 parts by weight of polyoxyethylenenonylphenolether. To the resulting mixture the same procedure as in Example 1 was carried out to obtain a plated product. The results of evaluating the plating properties are shown in Table 2, and the results of the mechanical strength and the thermal properties are shown in Table 3.

COMPARATIVE EXAMPLE 4

To 100 parts by weight of the composition as in Example 1, was added 5 parts by weight of maleic anhydride added-polypropylene, and a plated product was obtained in the same manner as in Example 1. The results of evaluating the plating properties are shown in Table 2.

COMPARATIVE EXAMPLE 5

To 100 parts by weight of polypropylene used in Example 1 was added 25 parts by weight of ABS resin used in Example 1, and a plated product was obtained in the same manner as in Example 1. The results of evaluating the plating properties are shown in Table 2.

COMPARATIVE EXAMPLE 6

To 100 parts by weight of polypropylene used in Example 11 was added 25 parts by weight of A-MA resin used in Example 13 and a plated product was obtained in the same manner as in Example 1. The results of evaluating the plating properties are shown in Table 2, and the results of the mechanical strength and the thermal properties are shown in Table 3.

Table 1

| Example | Appearance | Peeling Test (kg/cm) | Thermal Shock Test (+80° C. × 1 hour ~ −30° C. × 1 hour) |
|---|---|---|---|
| 1 | Good | 1.7 | 4 cycle : unchanged |
| 2 | " | 1.6 | 4 cycle : unchanged |
| 3 | " | 1.8 | 4 cycle : unchanged |
| 4 | " | 1.4 | 4 cycle : unchanged |
| 5 | " | 1.7 | 4 cycle : unchanged |
| 6 | " | 2.3 | 4 cycle : unchanged |
| 7 | " | 2.3 | 4 cycle : unchanged |
| 8 | " | 1.2 | 4 cycle : unchanged |
| 9 | " | 1.4 | 4 cycle : unchanged |
| 10 | " | 1.5 | 4 cycle : unchanged |
| 11 | " | 1.7 | 4 cycle : unchanged |
| 12 | " | 1.8 | 4 cycle : unchanged |
| 13 | " | 1.7 | 4 cycle : unchanged |
| 14 | " | 1.8 | 4 cycle : unchanged |
| 15 | " | 2.2 | 4 cycle : unchanged |
| 16 | " | 1.6 | 4 cycle : unchanged |
| 17 | " | 1.6 | 4 cycle : unchanged |
| 18 | " | 1.9 | 4 cycle : unchanged |
| 19 | " | 1.1 | 4 cycle : unchanged |
| 20 | " | 1.2 | 4 cycle : unchanged |
| 21 | " | 1.5 | 4 cycle : unchanged |
| 22 | " | 1.0 | 4 cycle : unchanged |
| 23 | " | 0.9 | 4 cycle : unchanged |
| 24 | " | 1.0 | 4 cycle : unchanged |
| 25 | " | 1.2 | 4 cycle : unchanged |

Table 2

| Comparative Example | Appearance | Peeling Test (kg/cm) | Thermal Shock Test (+80° C. × 1 hour ~ −30° C. × 1 hour) |
|---|---|---|---|
| 1 | Abundant non-plated portions | — | — |
| 2 | Partially non-plated rash | 0.2 | peel off with 2 cycles |
| 3 | Abundant non-plated portions | — | — |
| 4 | Abundant non-plated portions | — | — |
| 5 | Partially non-plated | 0.3 | peel off with 2 cycles |
| 6 | Partially non-plated | — | — |

Table 3

| Example | Mechanical Strength | | | Temperature of Thermal Deformation (6.4 kg/cm²) |
|---|---|---|---|---|
| | Tensile Strength (kg/cm²) | Tensile Elasticity (kg/cm²) | Bending Strength (kg/cm²) | |
| 1 | 292 | 3.46 × 10⁴ | 445 | 115° C. |

Table 3-continued

| Example | Mechanical Strength | | | Temperature of Thermal Deformation (6.4 kg/cm$^2$) |
|---|---|---|---|---|
| | Tensile Strength (kg/cm$^2$) | Tensile Elasticity (kg/cm$^2$) | Bending Strength (kg/cm$^2$) | |
| 2 | 250 | 2.52 × 10$^4$ | 402 | 105 |
| 3 | 264 | 2.46 × 10$^4$ | 370 | 102 |
| 5 | 253 | 2.95 × 10$^4$ | 410 | 98 |
| 6 | 306 | 3.04 × 10$^4$ | 482 | 123 |
| 7 | 288 | 2.72 × 10$^4$ | 394 | 115 |
| 8 | 298 | 3.22 × 10$^4$ | 435 | 117 |
| 9 | 274 | 2.49 × 10$^4$ | 388 | 108 |
| 10 | 235 | 2.05 × 10$^4$ | 345 | 95 |
| 13 | 285 | 3.25 × 10$^4$ | 430 | 110 |
| 15 | 280 | 2.85 × 10$^4$ | 436 | 108 |
| 16 | 218 | 2.23 × 10$^4$ | 312 | 92 |
| 19 | 288 | 3.10 × 10$^4$ | 425 | 113 |
| 23 | 285 | 3.04 × 10$^4$ | 430 | 115 |
| Comparative Example | | | | |
| 1 | 370 | 3.65 × 10$^4$ | 543 | 136 |
| 3 | 318 | 3.30 × 10$^4$ | 486 | 113 |
| 6 | 272 | 2.26 × 10$^4$ | 420 | 106 |

What is claimed is:

1. A polyolefin resin composition having excellent plating properties which comprises:
    (A) 100 parts by weight of a mixture consisting of from 20 to 80 weight percent of polyolefin resin and from 80 to 20 weight percent of inorganic filler,
    (B) from 3 to 60 parts by weight of a compound containing a cyano group, said compound containing a cyano group is at least one member selected from the group consisting of acrylonitrile-styrene resin, acrylonitrile-butadiene-styrene resin, acrylonitrile-methyl-acrylate resin, acrylonitrile-indene resin, acrylonitrile-itaconic acid resin, acrylonitrile-methyl-methacrylate-styrene resin, acrylonitrile-cyclopentadiene resin, terephthalodinitrile and β-naphthonitrile,
    (C) from 0 to 20 parts by weight of rubber, said rubber being at least one rubber selected from (1) solid diene rubber selected from the group consisting of isoprene rubber, butadiene rubber, styrene-butadiene rubber, and acrylonitrile-butadiene rubber, (2) liquid rubber having an average molecular weight of from about 500 to about 10,000, which is at least one member selected from the group consisting of 1,2-polybutadiene, 1,4-polybutadiene, styrene-butadiene copolymer, acrylonitrile-butadiene copolymer, polyisoprene, polychloroprene, 1,2-polypentadiene, acrylonitrile-butadiene copolymer, butadiene-isoprene copolymer and butadiene-pentadiene copolymer, and such polymers containing functional groups selected from carboxyl, hydroxy, mercapto, halogen, amino, aziridino, and epoxy, (3) unsaturated dicarboxylic acid half esters, (4) heat-decomposed rubber, and (5) ozone-decomposed rubber,
    (D) from 0 to 50 parts by weight of an unsaturated carboxylic acid added polyolefin resin, and
    (E) from 0 to 20 parts by weight of at least one surfactant selected from the group consisting of nonionic surfactant and polyethyleneglycol.

2. A polyolefin resin composition according to claim 1, which comprises: (A) 100 parts by weight of a mixture consisting of from 40 to 80 weight percent of said polyolefin and from 60 to 20 weight percent of said inorganic filler, (B) from 5 to 40 parts by weight of said compound containing a cyano group, (C) from 1 to 10 parts by weight of said rubber, (D) from 0.5 to 30 parts by weight of said unsaturated carboxylic acid added polyolefin resin, and (E) from 0.3 to 15 parts by weight of at least one surfactant selected from the group consisting of nonionic surfactant and polyethyleneglycol.

3. The polyolefin resin composition of claim 1 or claim 2 wherein said polyolefin resin is a member selected from the group consisting of low density polyethylene, medium density polyethylene, high density polyethylene, polypropylene, polybutene-1, poly-4-methylpentene-1, ethylenepropylene copolymer and ethylene-butene copolymer.

4. The polyolefin resin composition of claims 1 or 2, wherein the inorganic filler comprises at least one member selected from the group consisting of alumina, zinc white, magnesium oxide, calcium carbonate, talc, clay, silica, kieselguhr, mica, calcium sulfite, calcium sulfate, barium sulfate, titanium oxide, calcium silicate, glass powder, glass fiber, asbestos and gypsum fiber.

5. The polyolefin resin composition of claim 4, wherein the particle size of said inorganic filler is up to 10 microns.

6. The polyolefin resin composition of claim 1 or claim 2, wherein said rubber is a solid rubber selected from the group consisting of isoprene rubber, butadiene rubber, styrene-butadiene rubber and acrylonitrile-butadiene rubber.

7. The polyolefin resin composition of claim 1 or claim 2, wherein said rubber is liquid rubber having an average molecular weight of from about 500 to about 10,000, which is at least one member selected from the group consisting of 1,2-polybutadiene, 1,4-polybutadiene, styrene-butadiene copolymer, acrylonitrile-butadiene copolymer, polyisoprene, polychloroprene, 1,2-polypentadiene, acrylonitrile-butadiene copolymer, butadiene-isoprene copolymer and butadiene-pentadiene copolymer.

8. The polyolefin resin composition of claims 1 or 2, wherein said unsaturated carboxylic acid added polyolefin resin comprises a polyolefin resin containing an unsaturated carboxylic acid polar radical, and wherein said unsaturated carboxylic acid is at least one member of the group consisting of maleic acid, maleic anhydride, nudic anhydride, citraconic acid, crotonic acid, isocrotonic acid, mesaconic acid, itaconic acid, angelic acid, sorbic acid, methacrylic acid, itaconic anhydride, citraconic anhydride and acrylic acid, and said polyolefin resin is at least one member selected from the group consisting of low density polyethylene, medium density polyethylene, high density polyethylene, polypropylene, polybutene-1 and poly-4-methylpentene-1.

9. The polyolefin resin composition of claim 1 or claim 2, wherein said surfactant is at least one member selected from the group consisting of polyoxyethylene alkylether, polyoxyethylene alkylphenolether, polyoxyethylene alkylester, polyoxyethylene sorbitanalkylester, polyoxyethylene alkylamine and polyethylene glycol.

10. The polyolefin resin composition of claim 4, wherein said compound containing a cyano group is acrylonitrile-butadiene-styrene resin.

11. The polyolefin resin composition of claim 4, wherein said compound containing a cyano group is acrylonitrile-styrene resin.

12. The polyolefin resin composition of claim 4, wherein said compound containing a cyano group is acrylonitrile-methyl-acrylate resin.

* * * * *

UNITED STATES PATENT AND TRADEMARK OFFICE
CERTIFICATE OF CORRECTION

PATENT NO. : 4,199,491      Page 1 of 2
DATED : April 22, 1980
INVENTOR(S) : AKIO INAYOSHI et al It is certified that error appears in the above–identified patent and that said Letters Patent are hereby corrected as shown below:

Title page, ABSTRACT: the entire "ABSTRACT" should be deleted and reinserted at the beginning of Column 1 under the heading --BACKGROUND OF THE INVENTION--; the following should be inserted on the title page as the ABSTRACT:

---A polyolefin resin composition having excellent plating properties which comprises: (A) 100 parts by weight of a mixture consisting of from 20 to 80 weight percent of polyolefin resin and from 80 to 20 weight percent of inorganic filler, (B) from 3 to 60 parts by weight of a compound containing cyano group, (C) from 0 to 20 parts by weight of rubber, (D) from 0 to 50 parts by weight of unsaturated carboxylic acid added polyolefin resin and (E) from 0 to 20 parts by weight of nonionic surfactant and/or polyethyleneglycol.

The composition of the present invention is useful as a material for plating.---.

Column 1, line 60: before "by", ---determined--- should be inserted.

Column 2, line 53: rewrite "polymer" as ---polymers---.

UNITED STATES PATENT AND TRADEMARK OFFICE
CERTIFICATE OF CORRECTION

PATENT NO. : 4,199,491  Page 2 of 2
DATED : April 22, 1980
INVENTOR(S) : AKIO INAYOSHI et al It is certified that error appears in the above-identified patent and that said Letters Patent are hereby corrected as shown below:

Column 5, line 10: rewrite "prickled" as ---pickled---.

Column 9, line 27: before "radical", insert ---a---.

Signed and Sealed this

Twenty-eighth Day of October 1980

[SEAL]

Attest:

SIDNEY A. DIAMOND

Attesting Officer    Commissioner of Patents and Trademarks